United States Patent [19]

Kinzel et al.

[11] 4,329,613
[45] May 11, 1982

[54] RESONATOR COMPONENT MODULE

[75] Inventors: Hermann Kinzel; Peter Katsch, both of Munich, Fed. Rep. of Germany

[73] Assignee: Siemens Aktiengesellschaft, Berlin & Munich, Fed. Rep. of Germany

[21] Appl. No.: 140,713

[22] Filed: Apr. 16, 1980

[30] Foreign Application Priority Data

May 10, 1979 [DE] Fed. Rep. of Germany ....... 2918952

[51] Int. Cl.³ .......................................... H01L 41/08
[52] U.S. Cl. .................................... 310/344; 310/353
[58] Field of Search ................ 310/351, 353, 354–356, 310/348, 340–344

[56] References Cited

U.S. PATENT DOCUMENTS

| 2,443,700 | 6/1948 | Sylvester et al. | 310/353 |
| 2,470,134 | 5/1949 | Bitner | 310/342 |
| 2,651,731 | 9/1953 | Overbey et al. | 310/342 |
| 3,002,117 | 9/1961 | Vogt | 310/342 |
| 3,559,285 | 2/1971 | Kauffman | 29/630 |
| 3,796,968 | 3/1974 | Luscher | 310/353 |

FOREIGN PATENT DOCUMENTS

| 2755116 | 6/1979 | Fed. Rep. of Germany | 310/353 |
| 52-19989 | 2/1977 | Japan | 310/353 |
| 664278 | 5/1979 | U.S.S.R. | 310/353 |

Primary Examiner—Mark O. Budd
Attorney, Agent, or Firm—Hill, Van Santen, Steadman, Chiara & Simpson

[57] ABSTRACT

A resonator component module has circuitry contained in a dual-in-line package integrated circuit and a plate-shaped crystal resonator which is secured in place by upwardly bending opposite central leads of the dual-in-line package and forming the ends of the bent leads to receive and retain the plate. Appropriate other leads of the dual-in-line package are fixed to terminal pins held in a base plate to which external electrical connections are made. A protective cap is attached to the base plate to cover the integrated circuit and the resonator in a self-contained module.

6 Claims, 2 Drawing Figures

RESONATOR COMPONENT MODULE

BACKGROUND OF THE INVENTION

1. Field of the Invention

The present invention relates to electrical resonating components, and in particular to such a component in which the resonator and associated circuitry are contained in one module.

2. Description of the Prior Art

Integrated circuits performing a variety of electronic operations are available in numerous component packages. One such package having particularly wide application is known as a dual-in-line package in which the circuit is constructed on a substrate which is encapsulated in a generally rectangular housing from which a number of leads extend at the opposite longest sides. During manufacture of such packages, the leads originally all lie in a single plane and are subsequently bent downwardly at right angles to facilitate insertion of the component into a circuit board. Although the leads and methods of attaching same take many forms, a representative structure for such leads is that shown in U.S. Pat. No. 3,559,285.

One application of such integrated circuit components is in an oscillator circuit employing a crystal resonator to stabilize the oscillating frequency. Resonators generally used for this purpose are driven in the thickness shear mode and are advantageously comprised of a relatively thin crystal plate. In order to allow oscillation of the plate in the thickness shear mode, special precautions are necessary for connection and support of the resonator plate, in particular, the plate operates best when supported only at its edges.

It is a problem in the art to adequately and inexpensively support a resonator plate within a component containing other circuitry in a manner which also permits uncomplicated and automated assembly.

SUMMARY OF THE INVENTION

It is an object of the present invention to provide a resonator component module which contains a resonator plate and associated circuitry contained in an integrated circuit with the circuitry and plate supported in a single housing connectable to external circuitry.

The above object is inventively achieved by utilizing opposite central terminal elements of the integrated circuit dual-in-line package as supports for the resonator plate by upwardly bending the central terminal elements and forming the ends of each terminal element to receive the plate and retain same.

For use in this combination, two opposite central terminal elements of an integrated circuit dual-in-line package containing oscillator circuitry are bent at their respective ends to form a receptacle for receiving and supporting opposite edges of a plate resonator, and the terminal elements are bent upwardly to support the resonator plate above the dual-in-line package and substantially parallel thereto. The center of the dual-in-line package and the resonator plate are in approximate alignment.

The remaining terminal elements of the dual-in-line package are not bent, and remain in the plane configuration which results during manufacture of most dual-in-line packages, with the elimination of the step of downwardly bending the terminals at right angles. The terminal elements in the inventive module are soldered to terminal pins vertically secured in a base plate and which extend beneath the base plate for connection to external circuitry and/or insertion in a circuit board. The base plate and internal elements are covered with a protective cap for protection against dust and moisture.

A resonator component module is thereby constructed in a particularly space-saving configuration as well as a configuration which includes both the resonator and associated circuitry in one component which may then be inserted in a circuit board or otherwise attached to external circuitry. The configuration is inexpensive and is easily adaptable to automated assembly.

DESCRIPTION OF THE PREFERRED EMBODIMENTS

Figure 1:
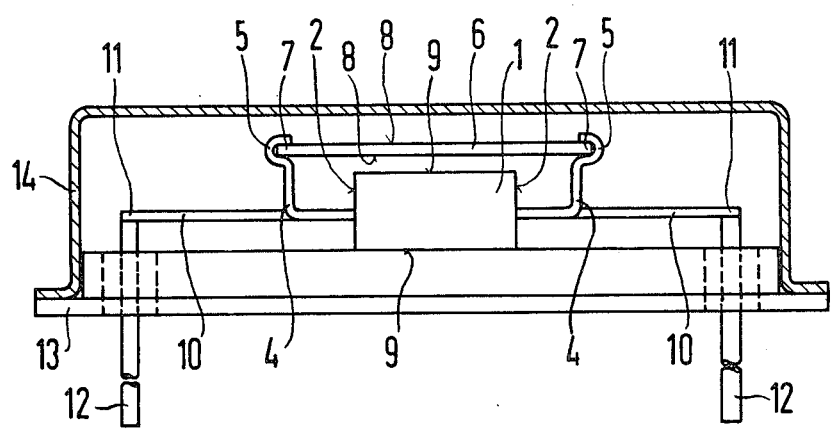
FIG. 1 is a side view, partly in section, of a resonator component module constructed in accordance with the principles of the present invention.

As shown in FIG. 1, a resonator component module includes a dual-in-line package 1, consisting of synthetic or ceramic material which contains integrated circuitry (not shown), has a plurality of terminal elements extending generally perpendicular to opposite vertical side walls 2. All of the terminal elements are initially in a single plane and are substantially parallel. In the interest of clarity, only central terminal elements 4 and outer terminal elements 10 are shown in FIGS. 1 and 2, however, it will be understood that a dual-in-line package 1 having any number of terminal elements may be utilized without departing from the inventive concept disclosed herein.

A pair of opposed central terminal elements 4 are bent upwardly a distance along the respective lengths thereof to receive and support a resonator plate 6 therebetween. The respective ends of the terminal elements are bent to form curved receptacles 5 for receiving edges 7 of the resonator plate 6 at substantially opposite positions along the perimeter thereof. The resonator plate 6 may be a disc-shaped plate operable in the thickness shear mode as is known in the art. The central terminal elements 4 are bent so as to exert no appreciable spring tension to retain the plate 6 therebetween, and do so not interfere with the resonating properties thereof.

Figure 2:
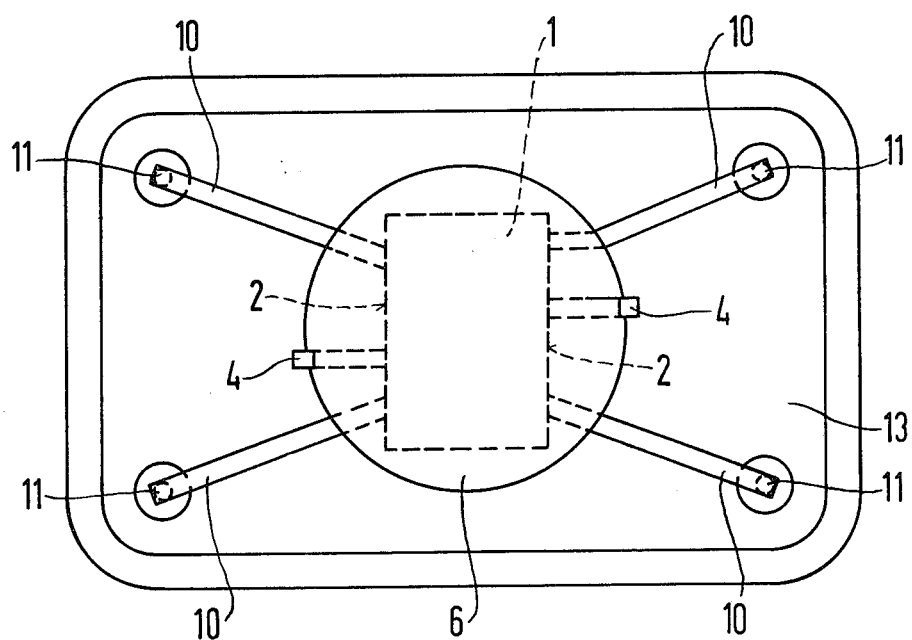
FIG. 2 is a plan view of the module of FIG. 1 with the protective cap removed.

When the resonator 6 is supported as shown in FIGS. 1 and 2, upper and lower surfaces 8 of the resonator 6 will be substantially parallel to upper and lower surfaces 9 of the dual-in-line package 1. The resonator 6 is thereby supported a fixed distance above the package 1. Moreover, as shown in FIG. 2, the centers of the dual-in-line package 1 and the resonator plate 6 are in substantial alignment.

The dual-in-line package may rest on a base plate 13 which carries a number of appropriately positioned vertical pins 12 therein, which extend a distance above and below the base plate 13. A corresponding number of outer terminal elements 10 of the dual-in-line package 1 are soldered thereto at respective ends 11. The outer terminal elements 10 remain in the same plane as originally received from the manufacturer, but may be bent at angles within that plane as shown in FIG. 2 in order to align with the pins 12.

A protective cap 14 is affixed to the base plate 13 to cover the plate 13, the dual-in-line package 1 and the resonator plate 6 in a manner known in the art to protect the components from dust and moisture.

The module consisting of the resonator plate 6 and the dual-in-line package 1 is thus operationally secured in a single housing which is isolated from the external environment. The resonator plate 6 is situated on that side of the package 1 which faces away from the base plate 13 at a short interval from said side, so that even after completion of the connection between the dual-in-line package 1 and the pins 12, the resonator plate 6 can be inserted between the central terminal elements 4. This further prevents damage to the resonator plate 6 during assembly, and insertion of the resonator plate 6 can be left to the last step in assembly before the cover 14 is fixed in place.

The module can then be connected to external circuitry by inserting the outwardly extending portions of the terminal pins 12 which project from the base plate 13 to corresponding bores of a printed circuit board (not illustrated) and affixing the pins therein by soldering or other means well known in the art. Although the module is particularly adapted to use with such a circuit board, external connections may be made by electrically connecting the pins 12 to such external circuitry in any other manner known in the art.

Although other modifications and changes may be suggested by those skilled in the art, it is the intention of the inventors to embody within the patent warranted hereon all changes and modifications which reasonably and properly come within the scope of their contribution to the art.

We claim as our invention:

1. A resonator component module comprising:
   a dual-in-line package containing at least one integrated circuit on a substrate in a substantially rectangular circuit housing and having a plurality of terminal elements extending from opposite sides of said circuit housing,
      opposite central ones of said terminal elements being upwardly bent at a distance along the respective lengths thereof and said central terminal elements having respective ends bent to form a U-shaped receptacle; and
   a resonator plate received and supported between said central terminal elements in said receptacles at a distance from said circuit housing; and
   a component housing containing said resonator plate and said dual-in-line package.

2. The module of claim 1 wherein said resonator plate is disposed substantially parallel to said circuit housing, and wherein said resonator plate and said circuit housing have centers in approximate alignment.

3. The module of claim 1 wherein said component housing includes a base plate having a plurality of terminal pins secured therein and wherein at least some of said dual-in-line package terminal elements not supporting said resonator plate are electrically and mechanically connected to said pins.

4. The module of claim 3 wherein said resonator plate is supported on a side of said dual-in-line package facing away from said base plate.

5. The module of claim 3 further including a protective cap affixed to said base plate and surrounding said dual-in-line package and said resonator plate for environmental isolation thereof.

6. A resonator component module comprising:
   a base plate;
   a plurality of terminal pins vertically secured in said base plate and extending a distance above and below said base plate;
   a dual-in-line package supported on said base plate, said dual-in-line package having a plurality of terminal elements extending from opposite sides thereof,
      opposite central ones of said terminal elements being upwardly bent a distance along the respective lengths thereof and terminating in a U-shaped receptacle,
      a remaining number of said plurality of terminal elements being electrically connected to said terminal pins in said base plate;
   a resonator plate supported by and secured between said central terminal elements in said U-shaped receptacles, said resonator plate and said dual-in-line package being disposed substantially parallel to each other; and
   a protective cap affixed to said base plate surrounding said dual-in-line package and said resonator plate for environmental isolation thereof.

* * * * *